United States Patent [19]

Yamashita

[11] 4,039,255

[45] Aug. 2, 1977

[54] COLOR DISPLAY DEVICE WITH DYE AND SYNTHETIC OIL SOLUTION

[76] Inventor: Akio Yamashita, 2-86, 2 chome, Seiwadai, Kawanishi, Japan

[21] Appl. No.: 689,047

[22] Filed: May 24, 1976

Related U.S. Application Data

[63] Continuation of Ser. No. 507,194, Sept. 18, 1974, abandoned.

[30] Foreign Application Priority Data

| Sept. 21, 1973 | Japan | 48-107142 |
| May 7, 1974 | Japan | 49-26498 |
| May 7, 1974 | Japan | 49-51010 |
| May 7, 1974 | Japan | 49-51011 |
| May 7, 1974 | Japan | 49-51012 |
| May 7, 1974 | Japan | 49-51013 |

[51] Int. Cl.² .............................................. G02F 1/25
[52] U.S. Cl. ........................... 350/160 R; 204/299 R
[58] Field of Search ............ 350/160 R; 324/324 EC; 340/173 CH; 204/181 PE, 299; 96/1 PE

[56] References Cited

U.S. PATENT DOCUMENTS

| 3,451,741 | 6/1969 | Manos | 350/160 R |
| 3,806,229 | 4/1974 | Schodt et al. | 350/160 R |

*Primary Examiner*—John K. Corbin
*Assistant Examiner*—Jon W. Henry
*Attorney, Agent, or Firm*—Cushman, Darby & Cushman

[57] ABSTRACT

A flat container, having a pair of electrodes facing each other with a specified gap inbetween, constituting two walls of the container, at least one of said electrodes being transparent, is filled with oil containing a dye. When a voltage is impressed across the electrodes, tint or color saturation of the oil seen from the transparent electrodes changes from non electrified state, and in some cases, changes further in accordance with increase of the impressed voltage.

11 Claims, 4 Drawing Figures

COLOR DISPLAY DEVICE WITH DYE AND SYNTHETIC OIL SOLUTION

This is a continuation of application Ser. No. 507,194 filed Sept. 18, 1974, now abandoned.

BACKGROUND OF THE INVENTION

As conventional color display device, organic solvent or water containing a specified dye dissolved therein, the solvent or water being held between a pair of electrodes, at least one of which is transparent, is already known. However, such conventional device was not practical in view of power consumption and rather shortness of life.

SUMMARY OF THE INVENTION

This invention purports to obtain a novel color display device having very little power consumption and long life.

This invention is characterized in that dye is contained in oil and held in a container between a pair of electrodes, at least one of which is transparent.

DETAILED DISCLOSURE OF THE INVENTION

Figure 1:
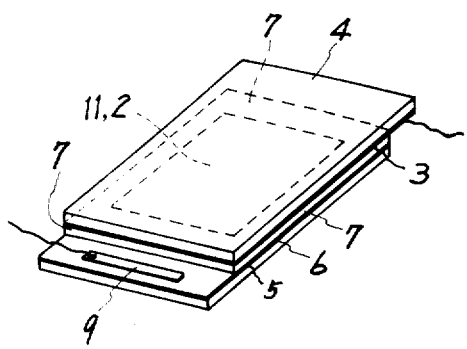
FIG. 1 is a perspective view of one example of a color display device embodying the present invention.
Figure 2:
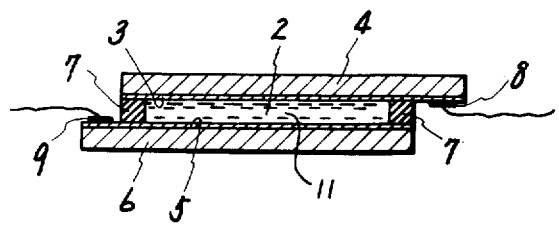
FIG. 2 is a sectional side view of the device of FIG. 1.
Figure 4:
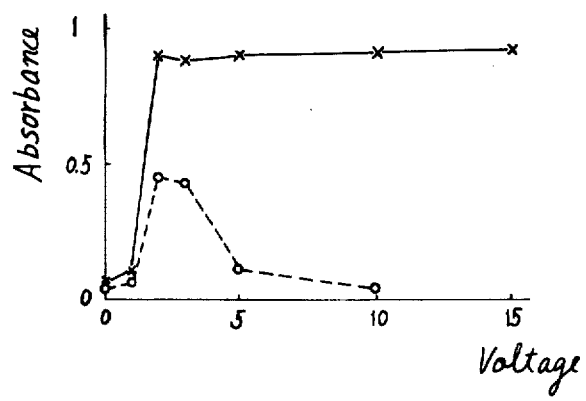
FIG. 4 is a chart showing characteristic curve of the example.

One example of the color display device of the present invention is shown in FIGS. 1 and 2 wherein, a pair of glass plates 4 and 6 with transparent electrodes 3 and 5, respectively, preferably made of $SnO_2$ film or $In_2O_3$ film, on one side oppose to each other with a specified narrow gap inbetween, so that the electrodes 3 and 5 face to each other. And an insulating wall 7 encircles the space 11 defined between the glass plates 4 and 6, so that the space is liquid-tightly sealed. Oil 2 containing a specified dye is filled in the abovementioned space. In the abovementioned example, both electrodes 3 and 5 are transparent, but one of the electrodes can be non-transparent. Many pairs of electrodes, instead of electrically single pair thereof, can be provided, so that various voltages can be impressed part by part.

Figure 3:
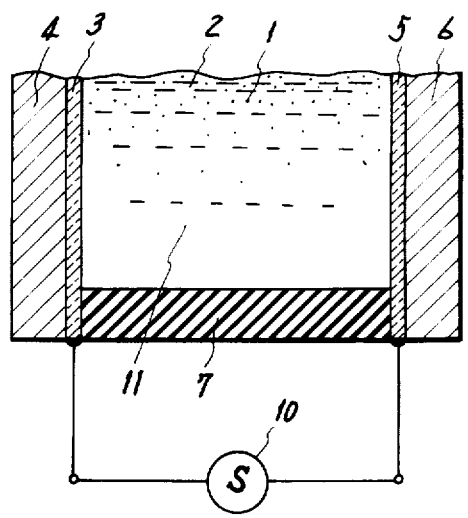
FIG. 3 is a schematic view of the device of FIGS. 1 and 2.

As shown in FIG. 3, the pair of electrodes 3 and 5 are connected to both terminals of an electric power source 10. The power source 10 can be either a D.C. power source or an A.C. power source.

As the dye, one or more dyes selected from the belowmentioned dyes can be used:

As organic dyes: nitroso dyes represented for example by naphthol green B, nitro dyes represented for example by naphthol yellow S, azo dyes represented for example by amaranth, stilbene dyes represented for example by chrysophenine G, diphenylmethane dyes represented for example by auramine, triarylmethane dyes represented for example by malachite green, xanthene dyes represented for example by rhodamine B, acridine dyes represented for example by acridine orange R, quinoline dyes represented for example by quinoline yellow, methine dyes represented for example by astrazon pink FG, polymethine dyes, thiazole dyes represented for example by thioflavine T, indamine dyes represented for example by indophenol blue, indophenol dyes, azine dyes represented for example by safranine T, oxyazine dyes represented for example by gallocyanine, thiazine dyes represented for example by methylene blue, sulfide dyes represented for example by sulfer black T, aminoketone dyes represented for example by helindon yellow CG, oxyketone dyes represented for example by naphthazarine, anthraquinone dyes represented for example by alizarine cyanine green G, indigoid dyes represented for example by indigo, and phthalocyanine dyes represented for example by pontamine fast turquoise 8GL.

As inorganic dyes: titanium oxide, zinc oxide, aureolin, cobalt green, cerulean blue, cobalt blue, cobalt violet, ochre, sienna, red oxide, prussian blue, chromium oxide, chrome yellow, viridian, mineral violet, emerald green, vanadium yellow, vanadium blue, vermilion, minium, cadmium yellow, ultramarine, and cadmium red.

As the oil: so-called mineral oil, i.e., hydrocarbons made from petroleum oil and synthetic oil can be used. As the hydrocarbon, paraffins, naphthenes, aromatics, and olefins can be used.

As synthetic oils: silicone oils, e.g., polydimethylsiloxane, arylalkane oils, and phosphoric esters, e.g., trihydrocarbyl phosphates such as tris decyl phosphate, tris(2-ethylhexyl) phosphate and other trialkyl phosphates, diphenyl decyl phosphate and other mixed arylalkyl phosphates, triphenyl phosphate, tri cresyl phosphate, cresyl diphenyl phosphate and other triaryl phosphates. As surface active agents there can be used for example anionic cationic or non-ionic surface active agents.

Hereinafter, details of the invention are elucidated referring to the following examples:

EXAMPLE 1

A dye having the below mentioned chemical formula (1), a dye of styrylpyridines, is dissolved into cresyl diphenyl phosphate, i.e., an oil of phosphate ester at the ratio of $1 \times 10^{-3}$ mol/l (i.e., $1 \times 10^{-3}$ mol of the dye in 1 liter of oil).

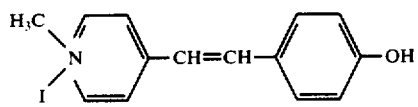

(1)

The resultant solution is put in the space 11 of the device shown in FIGS. 1 to 3.

When no voltage is impressed across the electrodes 3 and 5, the main spectral absorption exists around 380 mμ wavelength showing yellow tint. However, when 5 volts D.C. voltage is impressed across the electrodes 3 and 5, the main spectral absorption is around 574 mμ wavelength showing red tint. Since the cresyl diphenyl phosphate is an insulation oil, the power consumption is as low as below 0.01 μW/Cm² (i.e., $10^{-8}$ watt/Cm²). When the device is operated under 100° C temperature, no fading of tint is observed, and the operation is satisfactorily stable.

EXAMPLE 2

A dye having belowmentioned chemcial formula (2), namely 1, 3, 3-trimethyl indolino-6'-nitrobenzopyrilspiran, is dissolved into tricresyl phosphate at the ratio of $5 \times 10^{-3}$ mol/l (2)

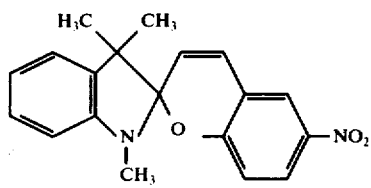

The resultant solution is put in the space 11 of the device shown in FIGS. 1 to 3.

When no voltage is impressed across the electrodes 3 and 5, the main spectral absorption exist around 250 mμ wavelength, showing neutral tint. However, when 10 volts D.C. voltage is impressed, the main spectral absorption is around 550 mμ showing red tint. The power consumption is as low as below 0.01 μW/Cm².

EXAMPLE 3

Fine powder of titanium oxide is contained in a arylalkane synthetic oil the trade mark of which is HIZOLE-SAS (prepared by Nippon Petrochemicals Co., Ltd. of Japan), at the ratio of 3 weight percent.

The resultant oil is put in the space 11 of the device shown in FIGS. 1 to 3.

When no voltage is impressed across the electrodes 3 and 5, the tint of oil is white. However, when 0 to 5 volts D.C. voltage is impressed, the tint of oil changes via pale blue to deep blue (highly saturated blue).

The power consumption is as low as below 0.01 μW/Cm².

In the abovementioned examples 1 to 3, the changes of tint or color saturation appear to be caused by electrochromism effect. In the following examples, the tint or color saturation is considered to be caused by oxidation-reduction reaction.

Example 4

Cresyl diphenyl phosphate is selected as oil and styrylpyridine dye having abovementioned formula (1) is dissolved into cresyl diphenyl phosphate at the ratio of $10^{-2}$ mol of the dye in 1 liter of the oil.

Also, about $10^{-2}$ mol/l of iodine and the similar amount of methanol are contained in the oil, so as to provide $I^-$ ions and $H^+$ ions, respectively therefrom for the sake of helping the color display.

The resultant solution is put in the space 11 of the device shown in FIGS. 1 to 3.

When no current exists between the electrodes 3 and 5, the tint of the solution is yellow. However, when a D.C. current is fed to flow through the electrodes 3 and 5, the solution shows red tint. In this operation, in the solution at the side of cathode, the oxidation-reduction reaction takes place, and the dye dissociates $H^+$ ions to form the belowmentioned quinon type formula (3).

(3)

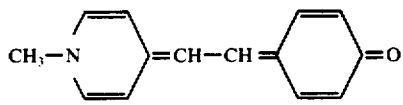

Since the gap between the electrodes 3 and 5 is as thin as 0.1 mm, whole dye in the device is actuated to show red tint.

When the current is cut off, the abovementioned quinon-converted dye associates the $H^+$ ions to form the s styryl type dye to restore yellow tint.

The power consumption of the device when actuated is as low as below 0.01 μW/Cm².

As is understood from the abovementioned description, in this example, the voltage causing the change of tint is the voltage at which the $H^+$ ions of the dye is dissociated, or the voltage at which anion of the solution is made so that the dye dissociates $H^+$ ions by means of the anion formed by the oxidation-reduction reaction. In such display device, it is preferable that the $H^+$ ions of the dye is dissociated at a voltage lower than the voltage at which the oil i.e., solution is dissociated to form anions.

For the dyes for such device, dyes comprising heterocycle of strong basicity and benzene ring are preferable. For instance, the following dyes are preferably used. In practical dispersion of these dyes into oils, surface active agents are preferably used in order to attain satisfactory dispersions. Especially for basic dyes which are liable to association, the surface active agents are effective.

(4)

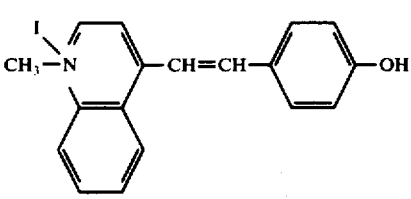

(5)

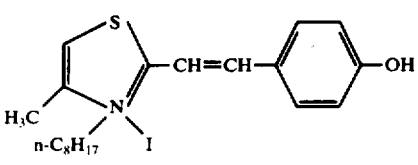

(6)

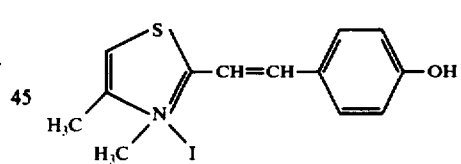

(7)

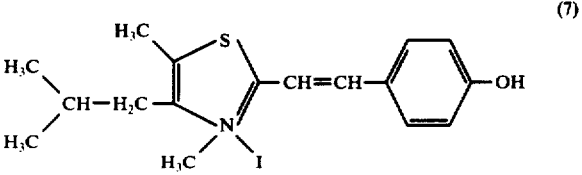

(8)

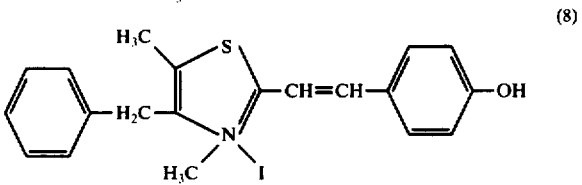

(9)

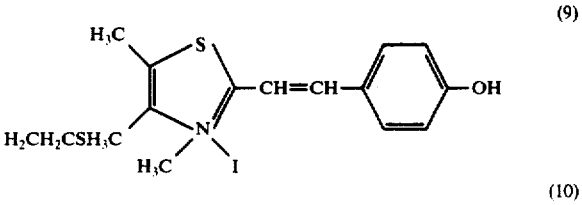

(10)

-continued

(11) [structure: methyl/phenyl indene with CH=CH—C₆H₄—OH, H₃C, H₃C, I substituents]

(12) C(OH)₃—[thiazolopyridine structure]—C=CH—C₆H₄—OH, with H₅C₂, I

(13) (CH₃)₂N—[quinoline structure]—CH=CH—C₆H₄—OH, with H₅C₂, I

(14) H₃C—[pyridinium]—C=CH—C₆H₄—OH, with CH₃, I

[indoline structure with H₃C, CH₃, C, CH=CH—C₆H₄—OH, H₃C, I]

The abovementioned dyes shown by the formulae (4) to (14) show the following color changes by impression of voltage across the electrodes 3 and 5.

| dye indicated by No. of formula | at 0 volt | from 2 volts up |
|---|---|---|
| 4 | pale yellowish green | bright violet |
| 5 | pale bright yellow | bright yellowish-red |
| 6 | pale bright yellow | bright yellowish-red |
| 7 | pale bright yellow | bright yellowish-red |
| 8 | vermilionish yellow | deep vermilionish red |
| 9 | deep yellow | deep vermilionish red |
| 10 | deep yellow | deep vermilionish red |
| 11 | vermilionish yellow | reddish violet |
| 12 | orange | wine reddish violet |
| 13 | pale yellow | bright orange |
| 14 | vermilionish yellow | pinky red |

EXAMPLE 5

In cresyl diphenyl phosphate as the oil, $10^{-2}$ mol/l of merocyanine dye is added as the dye, and further, a small amount ($10^{-4}$ to $10^{-1}$ mol/l) of polyoxyethylenehexadecil ether is added as surface active agent.

The resultant solution is put in the space 11 of the device shown in FIGS. 1 to 3.

When no voltage is impressed across the electrodes 3 and 5, the main spectral absorption exists around 400 mμ wavelength, showing yellow tint. However, when D.C. voltage is impressed, from 2 volts up the main spectral absorption of 547 mμ appears showing red tint. The wavelength of this absorption remains unchanged during the while impressed voltage is increased. Moreover, in this example, as shown by the solid line, the absorbance (i.e., optical density) of the solution also remains constant for over 2 volts. The dotted curve shows the absorbance for the solution prepared without the surface active agent. The dotted curve indicates that the absorbance falls down over 3 volts. Comparing the curves, it is understood that the surface active agent serves to prevent the dye from reacting with the electrode. The power consumption is as low as below 0.01 μW/Cm².

In the following, description is made concerning the case that dyes and quinone compounds are added together to the oils. The quinone compounds are characterized by having a pair of double bonds outside its ring. Depending on elements coupling with the double bonds, there are many types, namely, quinone type, quinoneimine, quinonediimine type, quinomethane type and quinodimethane type is paraquinoid type.

The quinone type includes benzoquinone, diphenoquinone, 1,4-naphthoquinone, anthraquinone, tetrachloro-1-benzoquinone, tetrabromo-P-benzoquinone, 2,3-dichloro-5,6-dicyano-P-benzoquinone.

The quinoneimine type includes quinonemonoimine, indophenol, indoaniline.

The quinonediimine type includes P-quinonediimine, indamine, azine, oxazine, thiazine.

These quinone compounds are liable to have absorption in visual wavelength range, and their absorbance generally changes depending on environmental electric field, and therefore they are good display materials. On top of this, these quinone compounds effects to prevent reaction between the electrode material and substance in the solution under the electric field, and to stabilize the reaction products by changing them into complex compounds, resulting in providing color display devices of long life.

EXAMPLE 6

Silicone oil is used as the oil, and $10^{-2}$ mol/l of naphthoquinone and $10^{-2}$ mol/l of Rhodamine B dye is added.

The resultant solution is put in the space 11 of the device shown in FIGS. 1 to 3.

When no voltage is impressed across the electrodes 3 and 5, the main spectral absorption exists around 561 mμ wavelength, showing red tint. However, when 10 volts D.C. voltage is impressed, the main spectral absorption is reduced showing faded red tint. The power consumption is as low as below 0.01 μW/Cm².

In this example, when no naphtholquinone is added, upon impressing a voltage over 5 volts D.C., the dye tint irreversibly fades out.

As other stabilizing agents, azo compounds and acid anhydrides are usable. Azo-compounds include azobenzene, azoxybenzene, azonaphthalene azoxynaphthalene, P-dimethylaminoazobenzene etc.

As the acid anhydrides, the compounds formed by condensation of two molecules of a carboxylic acid losing one water molecule can be used. For instance, acetic anhydride, propionic anhydride, benzoic anhydride, succinic anhydride, maleic anhydride, glutaric anhdride, phthalic anhydride, are usable.

EXAMPLE 7

Cresyl diphenyl phosphate is used as the oil and $5 \times 10^{-3}$ mol/l of azobenzene is added.

The resultant solution is put in the space 11 of the device shown in FIGS. 1 to 3.

When no voltage is impressed across the electrodes 3 and 5, the device is transparent.

However, when 10 volts D.C. voltage is impressed, the main spectral absorption is around 450 m$\mu$ showing yellow tint. After continuous operation of this device with 10 volts D.C. voltage at the high temperature of 60° C for long hours, even after 10,000 hours of operation, there is no fading of tint. The power consumption is as low as below 0.01 $\mu$W/Cm$^2$.

EXAMPLE 8

In a silicone oil, $5\times 10^{-3}$ mol/l of azoxybenzene and $10^{-2}$ mol/l of merocyanine dye are added together.

The resultant solution is put in the space 11 of the device shown in FIGS. 1 to 3.

When D.C. voltages between 2 to 10 volts are impressed across the electrodes 3 and 5, the main absorption at 547 m$\mu$ of the dye is increased, showing an increase of color saturation. This device has satisfactory characteristic in color display after continuous operation of 5,000 hours.

EXAMPLE 9

In a cresyl diphenyl phosphate, $10^{-2}$ mol/l of rhodamine B dye and $10^{-2}$ mol/l of phthalic anhydride are added together.

The resultant solution is put in the space 11 of the device shown in FIGS. 1 to 3.

When no voltage is impressed, the device shows main absorption at around 561 m$\mu$ wavelength. However, when a D.C. voltage of 2 to 15 volts is impressed the main absorption decreases. The ratio of maximum to minimum color saturation in accordance with the voltage change attains as high as 30:1 for long time over 5,000 hours of continuous operation at 60° C with 3 volts D.C. impression, while in a device without phthalic anhydride addition this ratio after 100 hours continuous operation at 60° C with 3 volts D.C. impression, decreases as low as to 5:1.

EXAMPLE 10

In a cresyl diphenyl phosphate, $10^{-2}$ mol/l of the styrylpyridine dye indicated by the formula (1) is dissolved together with $10^{-2}$ mol/l of polyoxyethylene hexadecil ether as surface active agent and $10^{-2}$ mol/l of parabenzoquinone as stabilizer.

The resultant solution is put in the space 11 of the device shown in FIGS. 1 to 3.

When no voltage is impressed across the electrodes 3 and 5, the solution shows yellow tint, and when a voltage over 2 volts is impressed the solution becomes red.

The device using this solution has such long life as over 10,000 hours for 60° C 10 volts' continuous operation.

EXAMPLE 11

In a cresyl diphenyl phosphate, $10^{-2}$ mol/l of the styrylpyridine dye indicated by the formula (1) is dissolved together with $10^{-2}$ mol/l of dodecylpyridinium chloride as surface active agent and $10^{-2}$ mol/l of hydroquinone as stabilizer.

The resultant solution is put in the space 11 of the device shown in FIGS. 1 to 3.

When no voltage is impressed across the electrodes 3 and 5, the solution shows yellow tint, and when a voltage over 2 volts is impressed the solution becomes red.

The device using this solution has such long life as over 10,000 hours for 60° C 10 volts' continuous operation.

EXAMPLE 12

In a cresyl diphenyl phosphate, $10^{-2}$ mol/l of the styrylpyridine dye indicated by the formula (1) is dissolved together with $10^{-2}$ mol/l of dodecylpyridinium chloride as surface active agent and $10^{-2}$ mol/l of azobenzene as stabilizer.

The resultant solution is put in the space 11 of the device shown in FIGS. 1 to 3.

When no voltage is impressed across the electrodes 3 and 5, the solution shows yellow tint, and when a voltage over 2 volts is impressed the solution becomes red.

The device using this solution has such long life as over 10,000 hours for 60° C 10 volts' continuous operation.

EXAMPLE 13

In a cresyl diphenyl phosphate, $10^{-2}$ mol/l of the styrylpyridine dye indicated by the formula (1) is dissolved together with $10^{-2}$ mol/l of polyoxyethylene hexadecil ether as surface active agent and $10^{-2}$ mol/l of benzoic anhydride as stabilizer.

The resultant solution is put in the space 11 of the device shown in FIGS. 1 to 3.

When no voltage is impressed across the electrodes 3 and 5, the solution shows yellow tint, and when a voltage over 2 volts is impressed the solution becomes red.

The device using this solution has such long life as over 10,000 hours for 60° C 10 volts' continuous operation.

EXAMPLE 14

In a cresyl diphenyl phosphate, $10^{-2}$ mol/l of the styrylpyridine dye indicated by the formula (1) is dissolved together with $10^{-2}$ mol/l of polyoxyethylene hexadecil ether as surface active agent, $10^{-2}$ mol/l of parabenzoquinone and $10^{-2}$ mol/l of azobenzene as stabilizers.

The resultant solution is put in the space 11 of the device shown in FIGS. 1 to 3.

When no voltage is impressed across the electrodes 3 and 5, the solution shows yellow tint, and when a voltage over 2 volts is impressed the solution becomes red.

The device using this solution has such long life as over 10,000 hours for 60° C 10 volts' continuous operation.

The gaps between the electrodes 3 and 5 for all the abovementioned Examples are preferably 0.01 to 0.1 mm. For the gap exceeding 0.1 mm the speed of color change becomes slower than 1 second, and therefore is inappropriate for display or sign. For the gap narrower than 0.01 mm, it is relatively difficult to make the gap precisely.

The contents of the dyes for all the abovementioned Examples are preferably $10^{-4}$ to $10^{-1}$ mol/l (i.e., $10^{-4}$ mol to $10^{-1}$ mol of dye for 1 liter of the oil). When the content is larger than $10^{-1}$ some of the dye associates and the device becomes relatively inefficient, while for the content lower than $10^{-4}$ the color is too faint for display. Therefore, optimum content for the abovementioned gap of 0.01 to 0.1 mm is around $10^{-2}$ mol/l.

When the voltage impressed across the electrodes 3 and 5 is increased from zero volt, the devices of the Examples with the abovementioned gap start change of their color tint or color saturation for the voltage of 2 volts up, and generally the change is increased by increase of the voltage. However, for voltages exceeding 20 volts, the change saturates and only power consumption increases redundantly.

The devices of the Examples have very long life of over 5,000 hours, in comparison with the conventional color display devices using water or inorganic solvent as the liquid.

What is claimed is:

1. A color display device comprising
   1. a container having a pair of electrodes with a specified gap in between, at least one of the electrodes being transparent for passing light therethrough,
   2. a liquid contained between said gap of the electrodes so that an electric field is applied thereto when a voltage is applied across the electrodes, wherein said liquid is a solution of an oil and at least
   3. one dye selected from the group consisting of: nitroso dyes, nitro dyes, azo dyes, stilbene dyes, diphenylmethane dyes, triarylmethane dyes, xanthen dyes, acridine dyes, quinoline dyes, methine dyes, polymethine dyes, thiazole dyes, indamine dyes, indophenol dyes, azine dyes, oxyazine dyes, thiazine dyes, sulfide dyes, aminoketone dyes, oxyketone dyes, anthraquinone dyes, indigoid dyes, and phthalocyanine dyes,
   wherein said oil is a synthetic oil.

2. The color display device of claim 1, wherein said synthetic oil is silicon, aryl alkane oil, trihydroxy carbyl phosphate, trialkyl phosphate or mixed aryl-alkyl phosphates.

3. A color display device consisting essentially of a container having a pair of electrodes with a specified gap in between, at least one of the electrodes being transparent for passing light therethrough,
   a liquid contained between said gap of the electrodes so that an electric field is applied thereto when a voltage is applied across the electrodes,
   wherein said liquid is a solution of an oil and at least one dye selected from the group consisting of: nitroso dyes, nitro dyes, azo dyes, stilbene dyes, diphenylmethane dyes, triarylmethane dyes, xanthen dyes, acridine dyes, quinoline dyes, methine dyes, polymethine dyes, thiazole dyes, indamine dyes, indophenol dyes, azine dyes, oxyazine dyes, thiazine dyes, sulfide dyes, aminoketone dyes, oxyketone dyes, anthraquinone dyes, indigoid dyes, and phthalocyamine dyes,
   wherein said oil is silicone oil, aryl alkane oil, trihydroxy carbyl phosphates, trialkyl phosphates or mixed aryl-alkyl phosphates.

4. The color display device of claim 3, wherein said oil is cresyl diphenyl phosphate.

5. The color display device of claim 4, wherein said dye is a styrylpyridine dye.

6. The color display device of claim 5, wherein said dye is one selected from dyes of the following formulae

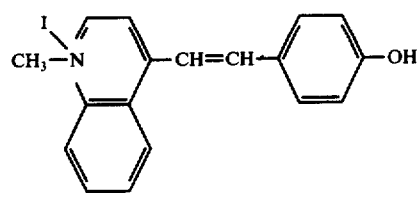

(4)

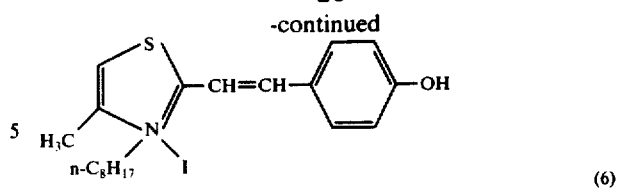

(5)

(6)

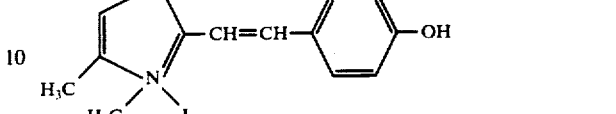

(7)

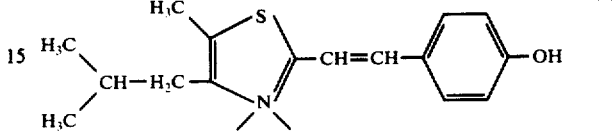

(8)

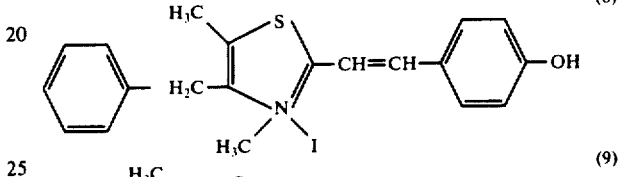

(9)

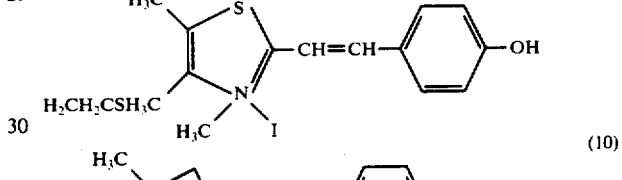

(10)

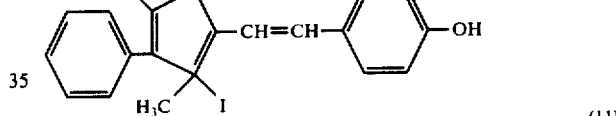

(11)

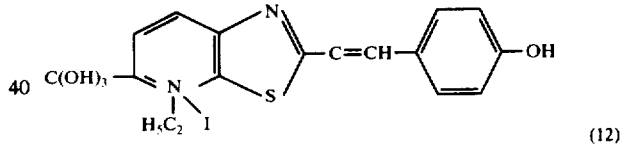

(12)

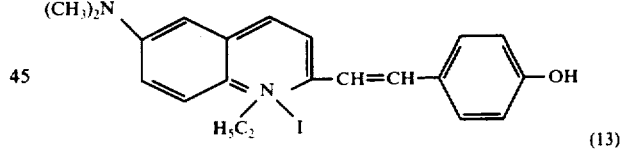

(13)

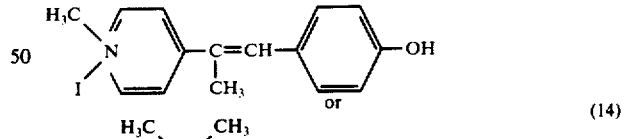

or (14)

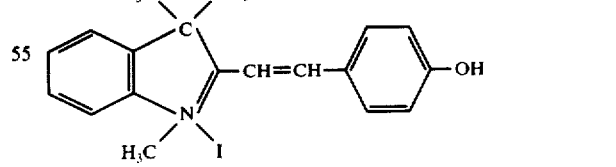

7. The color display device of claim 4, wherein said dye is a merocyanine dye.

8. The color display device of claim 3, wherein said solvent is silicon oil.

9. The color display device of claim 8, wherein the dye is a merocyanine dye or an azobenzene dye.

10. The color display device of claim 3, wherein said solvent is tricresyl phosphate.

11. The color display device of claim 10, wherein said dye is 1,3,3-trimethyl indolino-6'-nitrobenzopyrilspiran.

* * * * *